United States Patent [19]
Bocchino

[11] Patent Number: 5,869,979
[45] Date of Patent: Feb. 9, 1999

[54] TECHNIQUE FOR PRECONDITIONING I/OS DURING RECONFIGURATION

[75] Inventor: Vincent T. Bocchino, San Jose, Calif.

[73] Assignee: Altera Corporation, San Jose, Calif.

[21] Appl. No.: 647,102

[22] Filed: May 9, 1996

Related U.S. Application Data

[60] Provisional application No. 60/014,953 Apr. 5, 1996.
[51] Int. Cl.[6] .................................................. H03K 19/177
[52] U.S. Cl. ................................ 326/38; 326/39; 364/491
[58] Field of Search ................................ 326/38–41, 56; 364/490–491

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 3,761,695 | 9/1973 | Eichelberger . | |
| 3,783,254 | 1/1974 | Eichelberger . | |
| 3,806,891 | 4/1974 | Eichelberger et al. . | |
| 4,020,469 | 4/1977 | Manning | 340/172.5 |
| 4,124,899 | 11/1978 | Birkner et al. | 364/716 |
| 4,286,173 | 8/1981 | Oka et al. . | |
| 4,293,919 | 10/1981 | Dasgupta et al. . | |
| 4,298,980 | 11/1981 | Hajdu et al. . | |
| 4,366,393 | 12/1982 | Kasuya . | |
| 4,428,060 | 1/1984 | Blum . | |
| 4,476,560 | 10/1984 | Miller et al. . | |
| 4,488,259 | 12/1984 | Mercy . | |
| 4,546,273 | 10/1985 | Osman | 307/468 |
| 4,597,042 | 6/1986 | d'Angeac et al. . | |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |

(List continued on next page.)

FOREIGN PATENT DOCUMENTS

| | | |
|---|---|---|
| 0 511 752 | 11/1992 | European Pat. Off. . |
| 0 639 006 | 2/1995 | European Pat. Off. . |
| 1444084 | 7/1976 | United Kingdom ........... H03K 19/00 |
| 2 267 767 | 12/1993 | United Kingdom . |
| 84/1225 | 3/1984 | WIPO . |
| 84/02580 | 7/1984 | WIPO . |
| WO 92/20157 | 11/1992 | WIPO . |

OTHER PUBLICATIONS

Flex 8000 Programmable Logic Device Family Handbook, pp. 91–113, Aug. 1994.
Flex 8000 Programmable Logic Device Family Handbook, pp. 33–70, Aug. 1994.
IEEE Standard Test Access Port and Boundary–Scan Architecture, 1993.
Xilinx 4000 Logic Cell Array Families Handbook, pp. 2–7 thru 2–46, Aug. 1993.
Xilinx 3000 Logic Cell Array Families Handbook, pp. 2–105 thru 2–152, Aug. 1993.
Xilinx Corp., *The Programmable Logic Data Book*, XC2000, Logic Cell Array Families, pp. 2–187 to 2–216 (version 4, Aug., 1994).
Xilinx Corp., *The Programmable Logic Data Book*, "Boundary Scan in XC4000 Devices," pp. 8–45 to pp. 8–52 (1994).
Xilinx Corp., *The Programmable Logic Data Book*, "Boundary–Scan Emulator in XC3000 Devices," pp. 8–53 to pp. 8–59 (1994).

(List continued on next page.)

*Primary Examiner*—David R. Hudspeth
*Attorney, Agent, or Firm*—Townsend and Townsend and Crew LLP

[57] ABSTRACT

A technique for configuring programmable integrated circuits. The technique involves preconditioning or predefining the outputs and I/Os of a programmable integrated circuit before the device is programmed or reconfigured. When the device is programmed, the outputs and I/Os of the programmable integrated circuit will be driven to the preconditioned or predefined states. The technique may be implemented in conformance with the IEEE 1149.1 boundary scan architecture standard. Standard IEEE 1149.1 instructions may be used. The technique may also be used during in-system programming of programmable integrated circuits.

20 Claims, 5 Drawing Sheets

U.S. PATENT DOCUMENTS

| | | |
|---|---|---|
| 4,649,539 | 3/1987 | Crain et al. . |
| 4,667,325 | 5/1987 | Kitano el al. . |
| 4,670,877 | 6/1987 | Nishibe . |
| 4,677,318 | 6/1987 | Veenstra et al. .................. 307/465 |
| 4,680,733 | 7/1987 | Duforestel et al. . |
| 4,701,920 | 10/1987 | Resnick et al. . |
| 4,706,216 | 11/1987 | Carter .................................. 365/94 |
| 4,710,927 | 12/1987 | Miller . |
| 4,713,792 | 12/1987 | Hartmann et al. .................. 364/900 |
| 4,717,912 | 1/1988 | Harvey et al. ................. 340/825.83 |
| 4,750,149 | 6/1988 | Miller . |
| 4,760,517 | 7/1988 | Miller et al. . |
| 4,780,822 | 10/1988 | Miller . |
| 4,871,930 | 10/1989 | Wong et al. ........................ 307/465 |
| 4,899,067 | 2/1990 | So et al. ............................. 307/465 |
| 4,912,342 | 3/1990 | Wong et al. ........................ 307/465 |
| 4,912,522 | 3/1990 | Oates et al. . |
| 4,961,191 | 10/1990 | Nakagawa et al. . |
| 4,962,070 | 10/1990 | Ostertag . |
| 5,017,813 | 5/1991 | Galbraith et al. .................... 326/38 |
| 5,053,949 | 10/1991 | Allison et al. . |
| 5,079,693 | 1/1992 | Miller . |
| 5,099,481 | 3/1992 | Miller . |
| 5,121,006 | 6/1992 | Pedersen et al. ................... 307/465 |
| 5,175,859 | 12/1992 | Miller et al. . |
| 5,221,865 | 6/1993 | Philips et al. . |
| 5,241,224 | 8/1993 | Pedersen et al. ................... 307/465 |
| 5,260,610 | 11/1993 | Pedersen et al. ................... 307/465 |
| 5,260,611 | 11/1993 | Cliff et al. ......................... 307/465 |
| 5,317,212 | 5/1994 | Wahlstrom .......................... 307/465 |
| 5,331,645 | 7/1994 | Miller et al. . |
| 5,336,950 | 8/1994 | Popli et al. ......................... 307/465 |
| 5,350,954 | 9/1994 | Patel et al. ......................... 307/465 |
| 5,355,369 | 10/1994 | Greenberger et al. . |
| 5,361,373 | 11/1994 | Gilson ................................ 395/800 |
| 5,375,086 | 12/1994 | Wahlstrom .......................... 365/149 |
| 5,379,300 | 1/1995 | Yamahata et al. . |
| 5,392,296 | 2/1995 | Suzuki . |
| 5,398,250 | 3/1995 | Nozuyama . |
| 5,430,735 | 7/1995 | Sauerwald et al. . |
| 5,448,576 | 9/1995 | Russell . |
| 5,572,148 | 11/1996 | Lytle et al. ........................... 326/41 |
| 5,581,564 | 12/1996 | Miller et al. . |
| 5,594,367 | 1/1997 | Trimberger et al. .................. 326/41 |
| 5,644,496 | 7/1997 | Agrawal et al. ................... 326/39 X |
| B1 4,617,479 | 9/1993 | Hartmann et al. .................. 307/465 |

OTHER PUBLICATIONS

AT&T Microelec. Advance Data Sheet, Optimized Reconfigurable Cell Array (ORCA) Series Field–Programmable Gate Arrays, Feb. 1993, pp. 3–87.

Goel et al., "Electronic Chip–In–Place Test," Digest of Papers, 1982 International Test Conference, Nov. 15–18, 1982, pp. 83–90.

Komonytsky, "LSI Self–Test Using Level Sensitive Scan Design and Signature Analysis," Digest of Papers, 1982 International Test Conference, Nov. 15–18, 1982, pp. 414–424.

Zasio, "Shifting Away from Probes for Wafer Test," Digest of Papers, Compcon, Spring 83, 1983, pp. 395, 398.

Jones et al., "An Approach to a Testing System for LSI," Computer Aided Design of Digital Electronic Circuits and Systems, 1979, pp. 187–204.

Eichelberger et al., A Logic Design Structure for LSI Testability, Proceedings, 14th Design Automation Conference, 1977, pp. 462–468.

Konemann et al., "Built–in Test for Complex Digital Integrated Circuits," IEEE Journal of Solid–State Circuits, vol. SC–15, No. 3, Jun. 1980, pp. 315–319.

Turino, "Testability Circuit Solves SMT Board Access Problems," Electronic Packaging and Production, Jan. 1986, pp. 110–113.

Buchanan, "Scan–Design Methods Increase Testability of Standard Cells," Computer Design, Mar. 1, 1986, pp. 79–84.

Williams, "VLSI Testing," Computer, Oct. 1984, pp. 126–136.

"Variable Access Latch Test," IBM Technical Disclosure Bulletin, vol. 28, No. 10, Mar. 1986, pp. 4475–4477.

"Generalized Scan Test Technique for VLSI Circuits," IBM Technical Disclosure Bulletin, vol. 28, No. 4, Sep. 1985, pp. 1600–1604.

Barnes, "Interconnection Test Arrangement," IBM Technical Disclosure Bulletin, vol. 22, No. 8B, Jan. 1980, pp. 3679–3680.

Goel, "Logic–Array Isolation for Testing," IBM Technical Disclosure Bulletin, vol. 23, No. 7A, Dec. 1980, pp. 2794–2799.

DasGupta, "LSSD Scan Technique," IBM Technical Disclosure Bulletin, vol. 24, No. 8, Jan. 1982, p. 4425.

Saluja et al., "An Alternative to Scan Design Methods for Sequential Machines," IEEE Transactions on Computers, vol. C–35, No. 4, Apr. 1986, pp. 384–388.

"Checking Out VSLI With Standard Test Gear," Technology to Watch, Electronics, May 26, 1986, pp. 33–35.

Berglund, "Level–Sensitive Scan Design Test Chips, Boards, System," Electronics, Mar. 15, 1979, pp. 108–110.

"VSLI–Chip Test System Itself at Board Level," Technology to Watch, Electronics, Aug. 5, 1985, pp. 46–49.

Williams et al., "Design for Testability ––A Survey," IEEE Transactions on Computers, vol. C–31, No. 1, Jan. 1982, pp. 2–15.

Aylor et al., "Structured Design for Testability in Semicustom VLSI," IEEE Micro, Feb. 1986, pp. 51–58.

Westcott, "The Self–Assist Test Approach to Embedded Arrays," 1981 IEEE Test Conference, Paper 9.1, pp. 203–207.

Segers, "A Self–Test Method for Digital Circuits," 1981 IEEE Test Conference, Paper 4.1, pp. 79–85.

Gerner et al., "Scan Path in CMOS Semicustom LSI Chips?" 1984 IEEE International Test Conference, Paper 25.1, pp. 834–841.

Goel et al., "Electronic Chip–In–Place Test," 1982 IEEE Test Conference, Paper 3.6, pp. 83–89.

Goel et al., "Electronic Chip–In–Place Test," Proceedings 19th Design Automation Conference, 1982, Paper 30.1, pp. 482–488.

Saluja, "An Enhancement of LSSD to Reduce Test Pattern Generation Effort and Increase Fault Coverage," Proceedings of the 19th Design Automation Conference, 1982, Paper 30.2, pp. 489–494.

Grason et al., "Digital Test Generation and Design for Testability," Association for Computing Machinery, 1980, IEEE Catalog No. 0–8979102–0–6/80/0600/0175, pp. 175–189.

Hsu et al., "Selective Controllability: A Proposal for Testing and Diagnosis," Proceedings of the 1978 Semiconductor Test Conference, pp. 110–116.

Godoy et al., "Automatic Checking of Logic Design Structures for Compliance with Testability Ground Rules," Proceedings 14th Design Automation Conference, 1977, pp. 469–478.

DasGupta et al., "A Variation of LSSD and Its Implications on Design and Test Pattern Generation in VLSI," 1982 IEEE test Conference, Paper 3.3, pp. 63–66.

Hsu et al., "Structured Trace Diagnosis for LSSD Board Testing—An Alternative to Full Fault Simulated Diagnosis," Proceedings, 18th Design Automation Conference, 1981, Paper 44.3, pp. 891–897.

Becker et al., "Element Test and Maintenance Bus (ETM–Bus)," VHSIC Phase 2 Interoperability Standards, Version 1.0, IBM, Honeywell TRW, 1985, pp. 1–19.

Albicki et al., "Distribution of Control Signals in Self–Testing Designs," Technical Report EL–86–02, University of Rochester, College of Engineering and Applied Sciences, Department of Electrical Engineering, Rochester, N.Y., Feb. 1986 (Albicki), pp. 1–22 and Appendix, pp. A–1 to A–4.

Altera Corporation, Application Note 33, "Configuring FLEX 8000 Devices," May 1994, Version 3, pp. 33–71.

Altera Corporation, Application Note 38, "Configuring Multiple FLEX 8000 Devices," May 1994, Version 2, pp. 71–91.

Altera Corporation, Application Brief Note 39, "JTAG Boundary–Scan testing in Altera Devices," Nov. 1995, Version 3, pp. 1–28.

Altera Corporation, Application Note 45, "Configuring FLASHlogic Devices," Apr. 1995, Version 1, pp. 1–8.

Altera Corporation, Application Brief 141, "In–System Programmability in MAX 9000 Devices," Jun. 1995, Version 1, pp. 1–8.

Altera Corporation, Application Brief 145, "Designing for In–Systemm Programmability in MAX 7000S Devices," Jun. 1995, Version 1, pp. 1–9.

TECHNIQUE FOR PRECONDITIONING I/OS DURING RECONFIGURATION

This application claims priority from a provisional application, U.S. Provisional Application No. 60/014,953, filed Apr. 5, 1996.

BACKGROUND OF THE INVENTION

The present invention relates to the field of programming or configuring programmable integrated circuits. More specifically, the present invention provides a technique for preconditioning or predefining the outputs of a programmable integrated circuit before the integrated circuit is programmed or configured.

Programmable, or reconfigurable, integrated circuits are well known to those in the electronic art. Programmable integrated circuits include RAM memories, SRAM memories, EEPROM memories, Flash memories, programmable logic devices (PLDs), and many others. In particular, programmable logic devices are also well known to those in the electronic art. Such programmable logic devices are also commonly referred as PALs (Programmable Array Logic), PLAs (Programmable Logic Arrays), FPLAs (Field Programmable Logic Arrays), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application.

Programmable integrated circuits are programmed and reprogrammed (or reconfigured) to store particular data or perform a particular function. For example, EEPROMs may be programmed to store a data for a digital system. EEPROMs may be (electrically) erased and reprogrammed many times, as needed, to store different or additional data. Furthermore, serial EPROMs may be programmed to hold data for configuring PLDs. Serial EPROMs may be reprogrammed, as needed, for configuring the PLDs differently.

As a further example, PLDs are generally known in which many LABs are provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR. PLDs are programmed to provide particular logic functions. PLDs may be reconfigured many times to provide additional or different logic functions.

While such programmable integrated circuits have met with substantial success, such devices also meet with certain limitations, especially during the programming of such devices. Programmable integrated circuits are typically reprogrammed in a reconfiguration mode. In the reconfiguration mode, data is inputted into the integrated circuit to indicate the configuration of the logic elements, LABs, interconnect, and other components. This data may be input in different forms such as parallel bits or serial bits. In the reconfiguration mode, the outputs (which may include bidirectional I/Os) of the device will typically be in undefined states. For example, the outputs (and I/Os) may be logic high, logic low, or even at high impedance.

Furthermore, since the user generally does not and cannot control the state of the outputs during reconfiguration mode, the programmable integrated circuit may potentially damage itself or other components when it is being configured.

In particular, when entering the reconfiguration mode, the outputs of the programmable integrated circuit may be in states, possibly undefined, that may conflict with the devices, sources, or other components that are coupled to those outputs. For example, during the reconfiguration mode, an output of the programmable integrated circuit may become shorted with another component, which may result in serious damage to the devices.

This problem may be especially significant in the situation of in-system programming (ISP). ISP programming is a technique where a programmable integrated circuit is configured or programmed while resident in the system (e.g., remains a component in a digital system). The programmable integrated circuit need not be removed from the circuit board. ISP programming allows greater flexibility when reprogramming programmable circuits. For example, the configuration information in a programmable circuit may be upgraded as needed without requiring the removal and installation of components, or disassembly of the system. In fact, the programmable circuit may be reconfigured while the rest of the system is in normal operation.

Potential problems, however, may arise when using ISP programming. For example, a programmable integrated circuit is resident on a printed circuit board (PCB) of a digital system. The programmable integrated circuit may even be soldered to the board. During ISP programming, the programmable integrated circuit will be programmed while it remains on the PCB. Thus, during ISP programming, the programmable integrated circuit may not be easily isolated or decoupled from the other components of the system. Hence, because the outputs may be at undefined or unexpected states, damage may result to the programmable integrated circuit itself or other components in the system.

As can be seen, an improved technique for configuring and programming programmable integrated circuits is needed, especially a technique where a user can specify the output and I/O states before configuring the device.

SUMMARY OF THE INVENTION

The present invention is a technique for configuring programmable integrated circuits. The technique involves preconditioning or predefining the outputs and I/Os of a programmable integrated circuit before the device is programmed or reconfigured. The technique may be implemented in conformance with the IEEE 1149.1 boundary scan architecture standard. The technique may use standard IEEE 1149.1 instructions. The technique may be used with ISP programming.

Using the technique of the present invention, a user may precondition or define the state of the outputs, I/Os, and pads (or pins) before entering the reconfiguration or programming mode. More specifically, the user selects the states of the particular outputs and I/Os. For example, the outputs and I/Os may drive high, low, or be at a high impedance. The user loads this data into the reconfiguration path circuitry of programmable integrated circuit. In the reconfiguration mode, the outputs and I/Os will be at the user-specified, user-selected, defined states. The device may be programmed in the reconfiguration mode.

In an embodiment, the reconfiguration circuitry of the present invention includes a tristate buffer coupled to a pad. The tristate buffer is fed by a data path multiplexer, which selects between a normal data path of the integrated circuit and a reconfiguration data path. During normal operation, the normal data path of the integrated circuit is generally selected. During a reconfiguration mode, the reconfiguration data path is selected. The reconfiguration data path provides the user-selected data, which is used to determine the output state during the reconfiguration mode.

A control node of the tristate buffer is coupled to a tristate multiplexer. The control node controls whether the tristate buffer is enabled or disabled. When enabled, data will be output through the tristate buffer to the pad. When disabled, the tristate buffer will provide a high impedance or tristate the pad.

During normal operation, the tristate multiplexer generally selects a normal tristate path for controlling the tristate buffer. During the reconfiguration mode, the tristate multiplexer selects the reconfiguration tristate path. The reconfiguration tristate path provides the user-selected data for controlling the tristate buffer, which is used to determine whether the tristate buffer is enabled or disabled.

More specifically, the method of reconfiguring a programmable integrated circuit of the present includes the following steps: providing a user-selected input to the programmable integrated circuit; passing the user-selected input to a pad when the programmable integrated circuit is being reconfigured; and reconfiguring the programmable integrated circuit.

In a further embodiment of the present invention, a circuit which embodies the preconditioning technique of the present invention includes: a pad; a tristate buffer, coupled to the pad; and a first multiplexer, coupled through the tristate buffer to the pad, where the first multiplexer selects between a data path input and a user-selected data path input. The circuit may further include: a second multiplexer, coupled to a control node of the tristate buffer, where the second multiplexer selects between a tristate path input and a user-selected tristate path input; and a reconfiguration signal, coupled to the first multiplexer and the second multiplexer, for indicating when the programmable integrated circuit is in a reconfigure mode. During the reconfigure mode, the first multiplexer of this circuit of the present invention couples the user-selected data path input to the tristate buffer and the second multiplexer couples the user-selected tristate path input to the control node of the tristate buffer.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
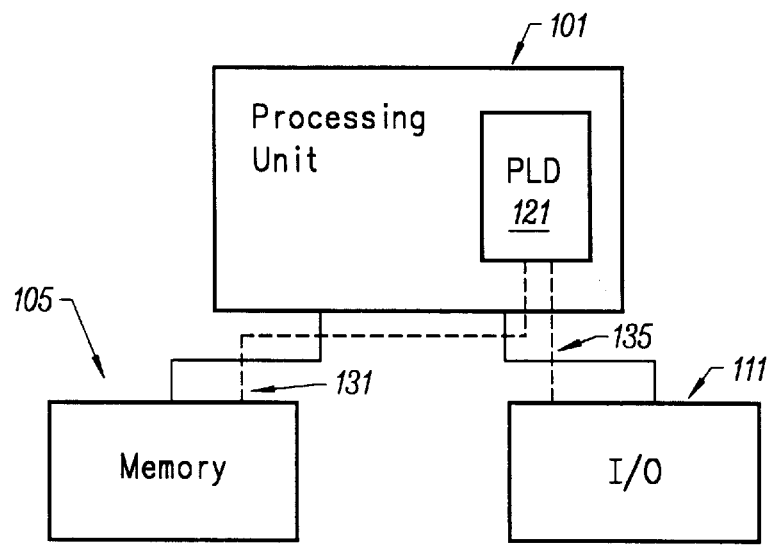
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
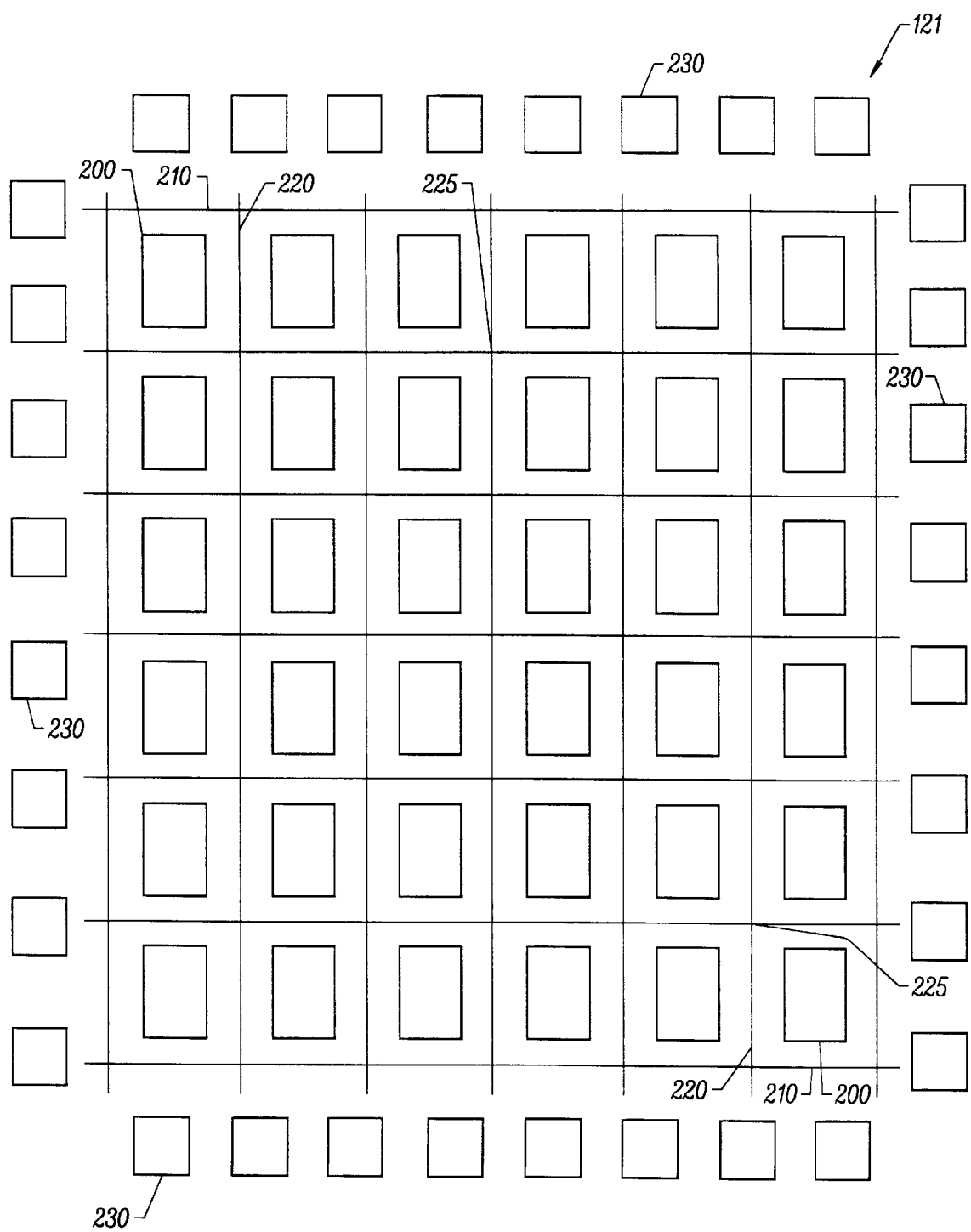
FIG. 2 is a block diagram showing the overall architecture of a programmable logic device.

FIG. 2 shows a six-by-six two-dimensional array of thirty-six logic array blocks (LABS) 200. LAB 200 is a physically grouped set of logical resources that is configured or programmed to perform logical functions. The internal architecture of a LAB will be described in more detail below in connection with FIG. 3. PLDs may contain any arbitrary number of LABS, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output drive takes internal signals and interfaces them to the outside world. A bidirectional driver performs the functions of both a input driver and an output driver. In addition, a bidirectional drive has a high-impedance mode which allows the driver to interface with a bidirectional bus. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
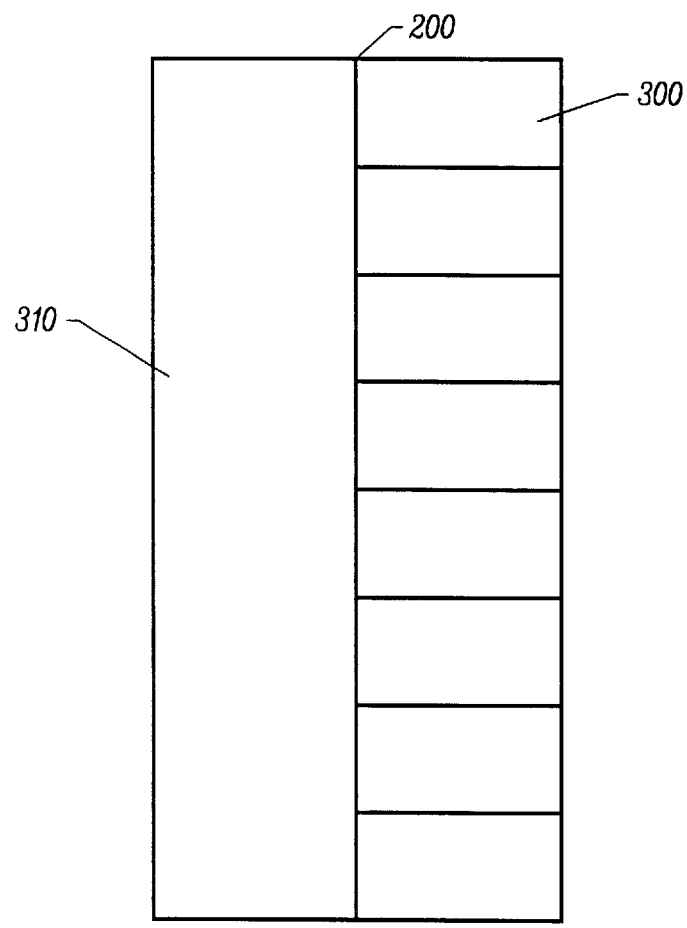
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops. Logic functions may also be performed using lookup tables, AND-OR arrays, product terms, and multiplexers, to name a few.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
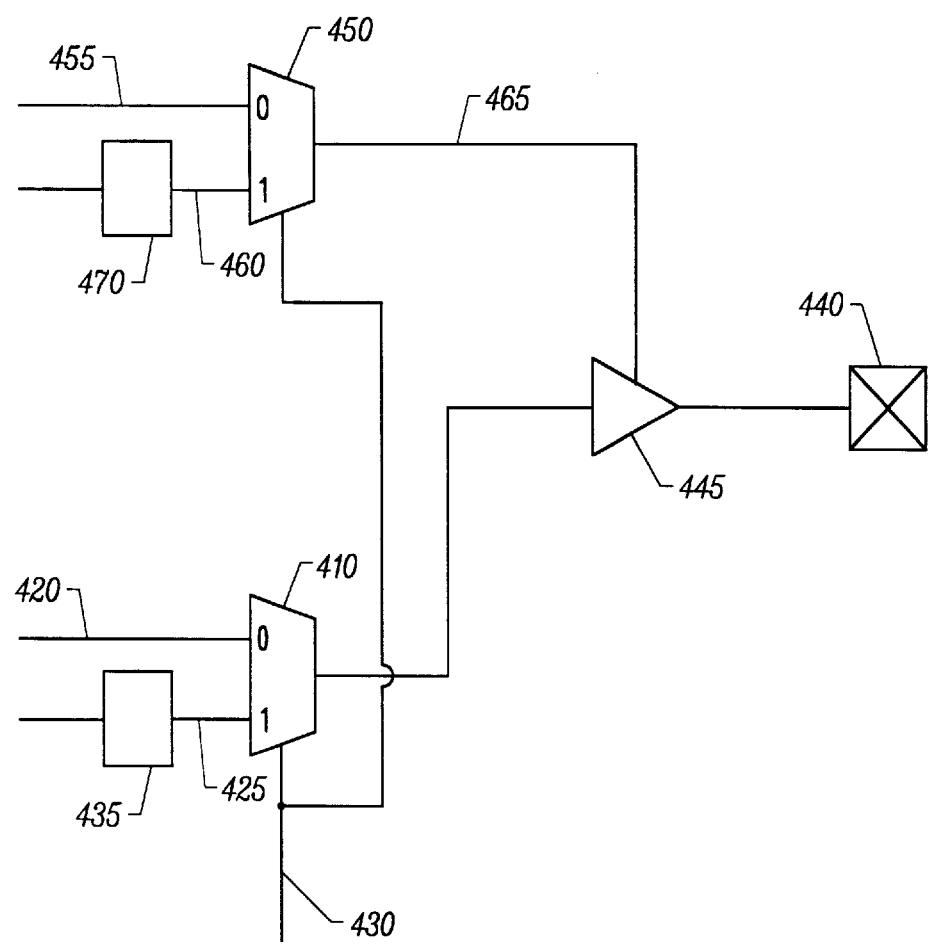
FIG. 4 is a schematic of an embodiment of the present invention.

FIG. 4 is a block diagram illustrating a circuit implementation of the preconditioning scheme of the present invention. The preconditioning scheme of the present invention is a technique for predefining or preconditioning the outputs of a programmable integrated circuit before the integrated circuit is configured in a reconfiguration mode. The technique is applicable to programmable logic devices, as well as other types of programmable and configurable integrated circuits including EPROMs, EEPROMs, CLAs, FPGAs, and many others.

As discussed in the Background section, a potential problem results when reconfiguring programmable circuits because during the reconfiguration mode, the outputs will typically be in unchangeable or undefined states. For example, the outputs may be logic high, logic low, or even at high impedance. Since the user generally does not and can not control the state of the outputs during reconfiguration mode, the programmable integrated circuit may potentially damage itself or other components when it is being configured.

In particular, when entering the reconfiguration mode, the outputs of the programmable integrated circuit may be states, possibly undefined, that may conflict with the devices, sources, or other components that are coupled to those outputs. For example, an output of the integrated circuit may become shorted with another component during the reconfiguration mode, which may result in serious damage to the devices.

The problem may be especially significant in the situation of in-system programming (ISP). ISP programming is a technique where a programmable integrated circuit is configured or programmed while resident in the system. ISP programming allows greater flexibility when reprogramming programmable circuits. For example, the configuration information in a programmable integrated circuit may be upgraded as needed without requiring the removal and installation of components, or disassembly of the system.

Potential problems, however, may arise when using ISP programming. For example, a programmable integrated circuit is resident on a printed circuit board (PCB) of a digital system. The programmable integrated circuit may even be soldered to the board. During ISP programming, the programmable integrated circuit will be programmed while it remains on the PCB. Thus, during ISP programming, the programmable integrated circuit may not be easily isolated or decoupled from the other components of the system. Hence, because the outputs may be at undefined or unexpected states, damage may result to the programmable integrated circuit itself or other components in the system.

The present invention may be used to prevent these problems. Using the technique of the present invention, a user may precondition or predefine an output of the programmable integrated circuit before entering the reconfiguration mode. Then, the output will be at an expected or desired state, thus avoiding the problems discussed above.

The circuit configuration shown in FIG. 4 will typically be used in the output path of the integrated circuit. In this embodiment, the output is tristateable. However, in other embodiments of the present invention, the output may not be tristateable, and the circuitry may be modified appropriately.

The circuitry in FIG. 4 may be part of an output buffer, input-output (bidirectional) buffer, bus driver, and other similar circuits. For example, this circuitry may be used to implement the input-output drivers of a programmable logic device as shown in FIG. 2.

In this embodiment of the present invention, a multiplexer 410 selects between a data path input line 420 and a user-selected input line 425. Multiplexer 410 is controlled by a control line 430. Signals may be provided on data path input line 420 for output from the integrated circuit. For example, in a programmable logic device, data path input line 420 may be programmably coupled to the LABs, LEs, GVs, GHs, and other components.

Control line 430 is used for selecting between the multiplexer inputs 420 and 425. Control line 430 will be typically coupled to a signal indicating whether the programmable integrated circuit is in a normal operation mode or a reconfiguration mode. During normal operation, a programmable logic device, for example, will perform the logic functions for which it has been configured. While during reconfiguration mode, the programmable logic device may be reconfigured or reprogrammed so that it may perform different or additional logic functions.

Typically during normal operation, control line 430 selects to pass a signal on data path input line 420 to a multiplexer output. During the reconfiguration mode, the control line 430 selects to pass a signal on user-selected input line 425 to the multiplexer output. User-selected input line 425 contains the data to be output during the reconfiguration mode.

User-selected input line 425 may be driven from various sources. For example, user-selected input line 425 may be driven by a LAB, LE, GH or GV, or input pin of a programmable logic device. User-selected input line 425 may also be coupled to a storage block 435 as shown in FIG. 4. Storage block 435 will hold the data which will be output during the reconfiguration mode. Storage block 435 may be a register, flip-flop, memory cell, or other component used to store data. In a preferred embodiment, storage block 435 is a register.

From multiplexer 410 output, either the data path input line 420 or user-selected input line 425 may be driven directly to a pad 440. However, in the embodiment shown in FIG. 4, to provide a tristateable output, multiplexer 410 output is driven through a tristate buffer 445 to pad 440.

Tristate buffer 445 may be enabled or disabled. When enabled, tristate buffer 445 outputs data at its input to 440. When disabled, tristate buffer 445 provides a high impedance (or tristate) at pad 440. Tristate buffer 445 provides additional functionality by allowing pad 440 to be tristated. For example, when tristated, pad 440 may be coupled to a bidirectional bus and used as an input.

Tristate buffer 445 is controlled by a way of a multiplexer 450. Based on a signal on control line 430, multiplexer 450 selectively couples either a tristate control input 455 or a user-selected tristate input 460 to a control line 465 of tristate buffer 455. For example, if control line 430 is high, user-selected tristate input 460 controls tristate buffer 445. If control line 430 is low, tristate control input 455 controls tristate buffer 445.

During normal operation mode, tristate control input 455 of multiplexer 450 will typically be selected to control the operation of tristate buffer 445. For example, in a programmable logic device, tristate control input 455 may be programmably coupled to various sources including LABS, LEs, GHs, GVs, and pads for controlling the tristate output of tristate buffer 445.

During reconfiguration mode, user-selected tristate input 460 will typically be selected to control the operation of tristate buffer 445. User-selected tristate input 460 may come from sources similar to that used for user-selected input line 425. For example, user-selected tristate input 460 may be driven by a LAB, LE, GH or GV, or input pin of a programmable logic device. User-selected tristate input 460 may also be coupled to a storage block 470. Storage block 470 will hold the data which will determine whether tristate buffer 445 is enabled or disabled during reconfiguration mode. Storage block 470 may be register, flip-flop, memory cell, or other component used to store data. In a preferred embodiment, storage block 470 is a register.

In operation, the circuitry of the present invention may be used to predefine or precondition the input-output pads, outputs, and I/Os of an integrated circuit during reconfiguration or reprogramming. This will avoid and prevent the problems described above. For example, using the present invention, the user may decide to tristate certain pads, drive high on certain pads, or drive low on certain pads.

The present invention allows a user to clearly define the states of the outputs during reconfiguration. When entering the reconfiguration mode, the outputs will be in known states. Thus, the user can ensure that the states of the outputs will not conflict or contend with other components. This avoids the problem of potentially damaging the programmable integrated circuit itself or other components in the system. As discussed above, this is especially useful for ISP programming.

To precondition the pads, user-selected input line 425 and user-selected tristate input 460 are driven to a known state before the reconfiguration mode. For example, to drive pad 440 high, user-selected input line 425 and user-selected tristate input 460 are driven high. Accordingly, in the reconfiguration mode, control line 430 will be high, and the user-selected inputs 425 and 460 are passed to tristate buffer 445. Tristate buffer 445 is enabled and pad 440 will be a logic high.

Similarly, a logic low may be driven to pad 440 by driving user-selected input line 425 low and user-selected tristate input 460 high before reconfiguring.

To place pad 440 in tristate for the reconfiguration mode, user-selected tristate input 460 should be driven low and user-selected input line 425 may be driven high or low (don't care).

Storage blocks 435 and 470 may be used to store the user-selected data for lines 425 and 460. The data for these storage blocks may be input into the device in many different ways. For example, data may be input into storage blocks 435 and 470 directly, serially, in parallel, cascaded through other devices, via GHs and GVs, via LABs and LEs, through dedicated pins, and many other ways.

In one embodiment, storage blocks 435 and 470 are part of a shift register. A user may specify user-selected data by serially loading and shifting this data into the appropriate storage blocks. Then, this data will control the output of the programmable integrated circuit during the reconfiguration mode.

Furthermore, in a typical integrated circuit, there may be a plurality of pads, including output and input-output pads. These output and input-output blocks may include the circuitry of the present invention. In such an embodiment, there would typically be a plurality of storage blocks (or a shift register) for holding user-selected preconditioning data. The user-selected data may be loaded in a shift register fashion by cascading and serpentining the data through the plurality of storage blocks.

Figure 5:
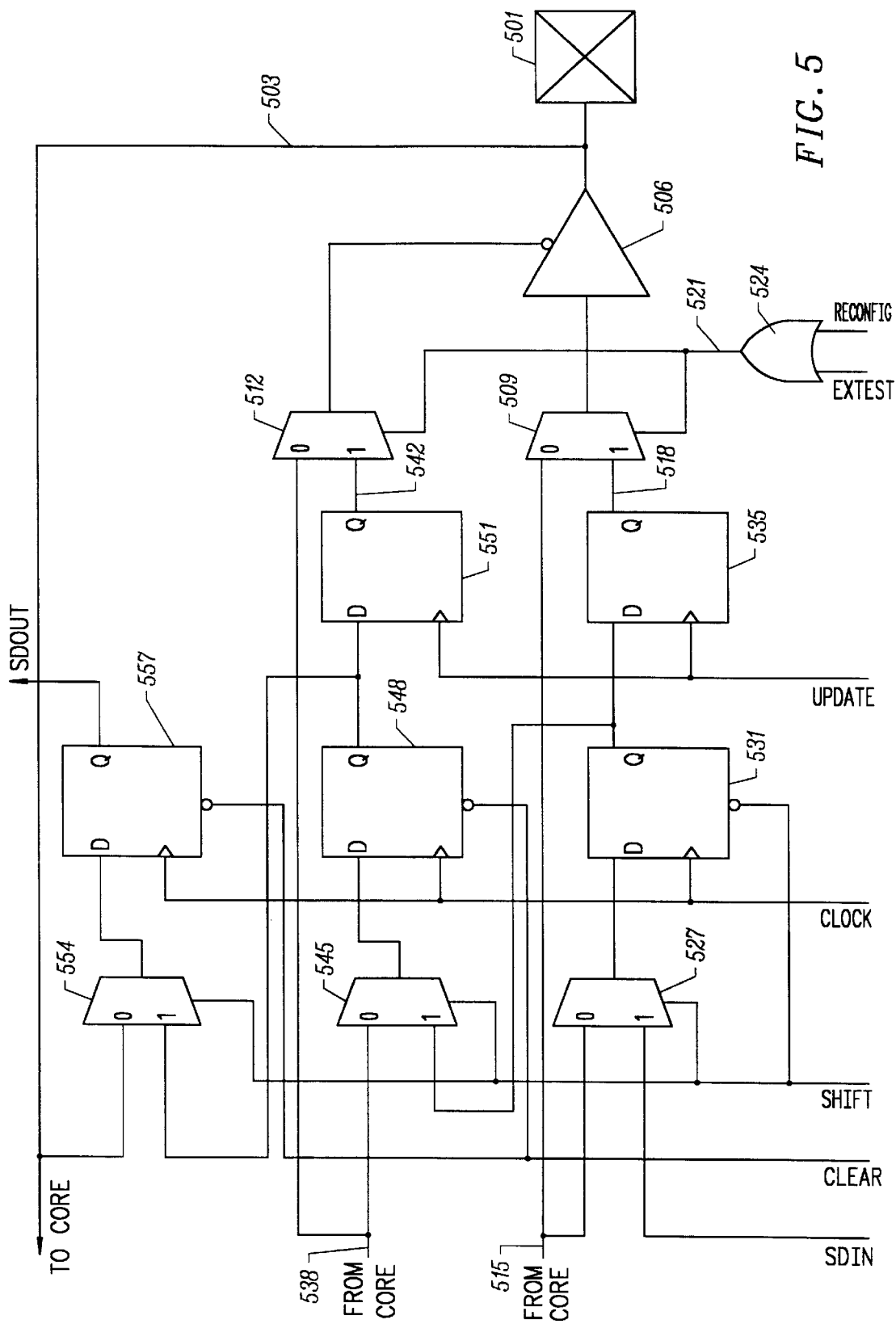
FIG. 5 is a schematic of an embodiment of the present invention which conforms to the IEEE 114.9.1 standard.

FIG. 5 shows another embodiment of the present invention. The circuity shown in FIG. 5 implements the present invention and also conforms to IEEE Standard 1149.1 (hereinafter "IEEE 1149.1"). The IEEE 1149.1 standard is described in IEEE Standard Test Access Port and Boundary-Scan Architecture, which is incorporated herein by reference. Since IEEE 1149.1 described what is known as a boundary scan architecture, the circuitry shown in FIG. 5 may also be referred to as a boundary scan cell.

IEEE 1149.1 was also developed in part by the Joint Test Action Group (JTAG), and was also adopted as a JTAG standard. A brief description of IEEE 1149.1 is given here, sufficient for understanding the invention. For a more detailed discussion, please refer to the IEEE 1149.1 documentation.

Generally, IEEE 1149.1 provides guidelines for device testing at the board level. IEEE 1149.1 provides standard instructions and functionality for testing integrated circuits. For example, some pins of an integrated circuit may be dedicated for receiving these IEEE 1149.1 instructions. The instructions can be used to exercise particular features such as checking the input and output paths, among others, of the integrated circuit.

The circuitry shown in FIG. 5 conforms to and provides the functionality of the IEEE 1149.1 standard. Furthermore, by using standard IEEE 1149.1 instructions, the circuitry in FIG. 5 may also be used to implement a preconditioning scheme of the present invention.

This circuitry is coupled to a pad 501, which may be used to output data from the integrated circuit. Furthermore, in cases when pad 501 is coupled to an input-output block, pad 501 may also he used to input data into the integrated circuit through input data line 503. Hence, pad 501 would be used bidirectionally. Furthermore, input data line 503 may also be used to feedback output data from the integrated circuit.

The output circuitry is tristateable. A tristate buffer 506, which may he enabled or disabled, is coupled to pad 501. When enabled, tristate buffer 506 drives a data output to pad 501. When disabled, tristate buffer 506 will tristate pad 501, placing pad 501 at a high impedance.

Tristate buffer 506 is coupled to a data path multiplexer 509 and a tristate path multiplexer 512. Data path multiplexer 509 provides data for output to pad 501 while tristate path multiplexer 512 provides data for controlling tristate buffer 506.

Data path multiplexer 509 selects between a data path input line 515 and a user-selected data input line 518. During normal operation, data path input line 515 typically provides data for output from internally within the integrated circuit. For example, in a programmable logic device, data path input line 518 may be programmably coupled to programmable interconnect lines, GHs, GVs, LABs, LEs, programmable cells, and other components.

A control node 521 controls the selection of multiplexers 509 and 512. In this embodiment, control 521 is coupled to a NOR gate 524 having inputs for an EXTEST signal and a RECONFIG signal. Although NOR gate 524 is shown controlling both multiplexers 509 and 512, the multiplexers 509 and 519 may be individually controlled by gates and circuitry in other embodiments. Furthermore, equivalent logic may be used without using NOR gates. For example, NAND, AND, OR, XOR, inverters, product terms, and combinations of these may be used to implement the logic to control multiplexers 509 and 512. Furthermore, control node 521 may also be controlled by way of programmable cells such as RAM, SRAM, EEPROM, EPROM, ROM, antifuse, and others.

User-selected data input line 518 provides for IEEE 1149.1 functionality. User-selected data input line 518 also provides for the output preconditioning functionality of the present invention.

Coupled between data path multiplexer 509 and a multiplexer 527 are a boundary scan register 531 and an update register 535. Boundary scan register 531 is sometimes referred to as a capture register. Multiplexer 527 selects between data path input line 515 and an SDIN input. A control node of multiplexer 527 is coupled to a SHIFT signal for controlling multiplexer selection.

Boundary scan register 531 and update register 535 are typically D-type registers, although other types of registers such as T, J–K, and S–R may be used. An output of multiplexer 527 is coupled to an input of boundary scan register 531. Boundary scan register 531 is clocked using a CLOCK signal. In this embodiment, boundary scan register 531 may be cleared, which may occur asynchronously, using a CLEAR signal. In other embodiments of the present invention, boundary scan register 531 may not include a clear feature.

An output of boundary scan register 531 is coupled to an input of update register 535. Update register 535 is clocked using an UPDATE signal. An output of update register 535 is coupled to data path input line 518.

Tristate multiplexer 512 is coupled to a tristate control node of tristate buffer 506. The tristate control node, which uses active low logic, controls whether tristate buffer 504 is enabled or disabled. For example, when the tristate control node is low, tristate buffer 506 will be enabled. When tristate control node is high, tristate buffer 506 is disabled.

Tristate multiplexer 512 selects from a tristate path input 538 and a user-selected tristate input 542. Tristate path input 538 is typically coupled internally within the integrated circuit for controlling tristate buffer 506 operation. For example, in a programmable logic device, may be programmably coupled to programmable interconnect lines, GHs, GVs, LABs, LEs, programmable cells, and other components.

User-selected tristate input 542 generally provides IEEE 1149.1 functionality. User-selected tristate input 542 also provides for the output preconditioning functionality of the present invention.

Coupled between tristate multiplexer 512 and a multiplexer 545 are a boundary scan register 548 and an update register 551. Boundary scan register 548 is sometimes referred to as a capture register. Multiplexer 545 selects between tristate path input 538 and the output of boundary scan register 531. A control node of multiplexer 545 is coupled to the SHIFT signal for controlling multiplexer selection.

Boundary scan register 548 and update register 551 are typically D-type registers, although other types of registers such as T, J–K, and S–R may be used. An output of multiplexer 545 is coupled to an input of boundary scan register 548. Boundary scan register 548 is clocked using the CLOCK signal. In this embodiment, boundary scan register 548 may be cleared, which may occur asynchronously, using the CLEAR signal. However, in other embodiments of the present invention, boundary scan register 548 may not include the clear feature.

An output of boundary scan register 548 is coupled to an input of update register 551. Update register 551 is clocked using the UPDATE signal. An output of update register 551 is coupled to tristate path input 542.

Input data line 503 may be selectively coupled through a multiplexer 554 to a boundary scan register 557. The output of boundary scan register 548 may also be selectively coupled through multiplexer 554 to boundary scan register 554. Multiplexer 554 is controlled by the SHIFT signal. Boundary scan register 557 is clocked using the CLOCK signal. Boundary scan register 557 may be cleared, which may occur asynchronously, using the CLEAR signal. An output of boundary scan register 557 is coupled it SDOUT, which is typically for a serial data output.

In operation, the circuit shown in FIG. 5 conforms to the IEEE 1149.1 standard. For a programmable integrated circuit, the circuitry may be used to provide IEEE 1149.1 functionality and also precondition the outputs during reconfiguration.

The EXTEST signal and RECONFIG signal are used to indicate the particular mode operation. For example, typically during normal operation, the EXTEST signal and RECONFIG signal are logic low. Then, the boundary scan architecture circuitry will be effectively bypassed. And data path input 515 and tristate path input 538 are used to determine and control the output. When exercising the boundary scan features of IEEE 1149.1, EXTEST will be logic high, thus enabling these functions to be performed. IEEE 1149.1 functions are described in IEEE Standard Test Access Port and Boundary-Scan Architecture document discussed above.

For preconditioning the output, RECONFIG signal will be logic high during reconfiguration mode. Then, multiplexers 509 and 512 will select registers 535 and 551, respectively, to determine and control the output. In particular, the preconditioning technique of the present invention may be implemented using IEEE 1149.1 conventions.

Figure 6:
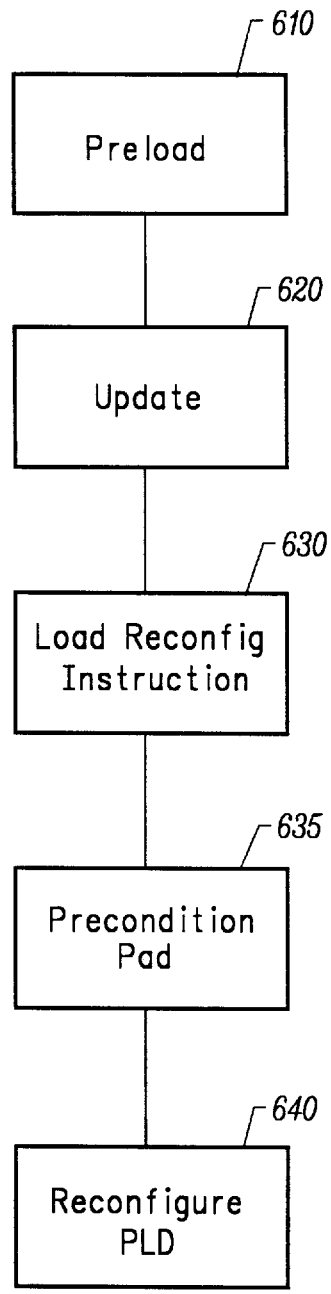
FIG. 6 is a flow diagram illustrating a technique of the present invention.

For example, FIG. 6 shows of flowchart of an implementation of the present invention using the circuitry in FIG. 5. In a step 610, a user preloads boundary scan registers 531 and 548 with user-selected data. In the IEEE 1149.1 standard, this may be accomplished using a "preload" instruction. The user will input data, and this user-selected data will determine the preconditioned state of a particular output. Specifically, data may be preloaded through SDIN. SHIFT is set to a logic high. This configures boundary scan registers 531, 548, and 557 to be linked serially in a serpentine fashion. Then, in response to the CLOCK signal, data may be clocked into boundary scan registers 548, 531, and 557 serially in a shift register fashion.

When the integrated circuit contains a plurality of pads, a plurality of boundary scan cells of FIG. 5 may be used. There may be a boundary scan cell of FIG. 5 associated with each pad 501. Accordingly, the boundary scan registers of these cells of the integrated circuit may be linked in serial serpentine fashion. For example, the SDOUT output of a first boundary scan cell may be linked to the SDIN input of a second boundary scan cell, and so forth. Data may be loaded and clocked into the boundary scan registers of the integrated circuit in a serial shift register fashion.

The data loaded into boundary scan register 548 will determine whether tristate buffer 506 is enabled or disabled. For example, if a logic low is loaded into boundary scan register 548, then tristate buffer 506 will be enabled. On the other hand, if a logic high is loaded into boundary scan register 548, then tristate buffer 506 will be disabled.

The data loaded into boundary scan register 531 will determine whether the output will drive high or low at pad 501 when tristate buffer 506 is enabled. For example, if a logic low is loaded into boundary scan register 531, then the output at pad 501 will be a low. On the other hand, if a logic high is loaded into boundary scan register 531, then the output at pad 501 will be a high.

In a further embodiment of the present invention, during step 610, boundary scan register 531, 548, and 557 are cleared using the CLEAR signal before user-selected data is preloaded. In particular, by clearing boundary scan registers 531, 548, and 557, tristate buffer 506 is enabled to pass a logic low. Consequently, a low will be provided at pad 501. This feature handles cases where the user does not wish to precondition pad 501. This feature may also be used to provide backwards compatibility to previous generation programmable integrated circuits which do not permit the preconditioning technique of the present invention. By clearing the boundary scan registers, this ensures that the state of pad 510 will be low unless the user preloads the registers with other data. This provides a known state at pad 510.

In a step 620, the data stored in boundary scan registers 531 and 548 are transferred into update registers 535 and 551, respectively. In the IEEE 1149.1 standard, this may be accomplished using an "update" instruction. More specifically, data clocked into boundary scan registers 531 and 548 in step 610 are output and coupled to the inputs of update registers 535 and 551. Then, this data is clocked into update registers 535 and 551 in response to the UPDATE signal.

In a step 630, the integrated circuit is placed into the reconfiguration mode. This may be accomplished using a "reconfiguration" instruction. In particular, the RECONFIG signal will be set to a logic high.

In a step 635, the user-selected data is provided to precondition, preconfigure, or predefine pad 501 to the user-defined state. Specifically, in response to RECONFIG, multiplexers 509 and 512 will couple update registers 535 and 551 to the input and control node, respectively, of tristate buffer 506. Accordingly, pad 501 will be at the user-defined state (i.e., logic high, logic low, or tristate).

In a step 640, the integrated circuit may be reconfigured, programmed, or reprogrammed. The programmable integrated circuit may be programmed using various techniques. As discussed above, because the states of the pads may be preconditioned before the reconfiguration mode, this prevents possible damage (e.g., from shorts, etc.) to the integrated circuit part itself and the system and other components. This is especially useful for an in-system programming environment.

After reconfiguring or reprogramming the programmable integrated circuit, the reconfiguration mode is exited, and the device may be used to provide the newly configured functions.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method for reconfiguring a programmable integrated circuit comprising:

providing a user-selected input to the programmable integrated circuit;

driving a pad with the user-selected input when the programmable integrated circuit is being reconfigured, wherein the user-selected input is coupled to a first input of a multiplexer and a data path signal is coupled to a second input of the multiplexer, wherein an output of the multiplexer is coupled to the pad and a control node of the multiplexer is coupled to be controlled by a signal indicating whether the programmable integrated circuit is being reconfigured; and reconfiguring the programmable integrated circuit.

2. The method of claim 1 wherein the user-selected input is driven through a tristate buffer.

3. The method of claim 1 wherein the programmable integrated circuit is reconfigured while on a circuit board.

4. The method of claim 1 wherein providing a user-selected input comprises storing the user-selected input into a register.

5. The method of claim 1 wherein the user-selected input is shifted serially into the programmable integrated circuit.

6. The method of claim 1 wherein the multiplexer is part of a JTAG boundary scan cell.

7. The method of claim 1 wherein driving a pad with the user-selected input comprises using an IEEE standard 1149.1 instruction.

8. A method of reconfiguring a programmable integrated circuit comprising:

transferring a first signal stored in a first register from the first register to a third register in response to an update signal;

transferring a second signal stored in a second register from the second register to a fourth register in response to the update signal;

controlling a control node of a tristate buffer with the second signal from the fourth register when the programmable integrated circuit is in a reconfigure mode; and transferring the first signal to the tristate buffer when the programmable integrated circuit is in the reconfigure mode, wherein the first signal is driven through the tristate buffer to a pad when the second signal enables the tristate buffer, and the pad is in a high-impedance state when the second signal-disables the tristate buffer.

9. The method of claim 8 further comprising:

in response to a shift signal, linking an output of the first register to an input of the second register;

shifting the second signal through the first register into the second register; and shifting the first signal into the first register.

10. The method of claim 8 further comprising:

initializing the first register and the second register by clearing the first register and second register.

11. The method of claim 8 wherein during controlling a control node of a tristate buffer, a multiplexer decouples a data path input from the tristate buffer and couples the first signal to the tristate buffer.

12. The method of claim 8 wherein during controlling a control node of a tristate buffer, a multiplexer decouples a tristate path input from the tristate buffer and couples the second signal to the control node of the tristate buffer.

13. The method of claim 8 further comprising:

programming the programmable integrated circuit when the programmable integrated circuit is in the reconfigure mode.

14. The method of claim 8 wherein the first register, second register, third register, and fourth register are part of a JTAG boundary scan cell.

15. The method of claim 8 wherein transferring the first signal the tristate buffer comprises using an IEEE standard 1149.1 instruction.

16. A circuit apparatus for a programmable integrated circuit comprising:

a pad;

a tristate buffer, coupled to the pad;

a first multiplexer, coupled through the tristate buffer to the pad, wherein the first multiplexer selects between a data path input and a user-selected data path input;

a second multiplexer, coupled to a control node of the tristate buffer, wherein the second multiplexer selects between a tristate path input and a user-selected tristate path input; and a reconfiguration signal, coupled to the first multiplexer and the second multiplexer, for indicating when the programmable integrated circuit is in a reconfigure mode, wherein during the reconfigure mode, the first multiplexer couples the user-selected data path input to the tristate buffer and the second multiplexer couples the user-selected tristate path input to the control node of the tristate buffer.

17. The circuit of claim 16 further comprising:

a first register, coupled to the user-selected data path input; and a second register, coupled to the user-selected tristate path input.

18. The circuit of claim 16 further comprising:

a third register, coupled to the first register, wherein the third register provides a clear function; and a fourth register, coupled to the second register, wherein the fourth register provides a clear function.

19. The circuit of claim 16 wherein the data path input may be programmably coupled to the global interconnect of the programmable integrated circuit.

20. A system comprising a programmable integrated circuit as recited in claim 18.

* * * * *